(12) United States Patent
Dixon et al.

(10) Patent No.: US 10,212,806 B2
(45) Date of Patent: Feb. 19, 2019

(54) ABSORBER ASSEMBLIES HAVING A DIELECTRIC SPACER, AND CORRESPONDING METHODS OF ASSEMBLY

(71) Applicant: Laird Technologies, Inc., Chesterfield, MO (US)

(72) Inventors: Paul Francis Dixon, Sharon, MA (US); Mohammadali Khorrami, Foxboro, MA (US)

(73) Assignee: Laird Technologies, Inc., Chesterfield, MO (US)

( * ) Notice: Subject to any disclaimer, the term of this patent is extended or adjusted under 35 U.S.C. 154(b) by 0 days.

(21) Appl. No.: 15/862,334

(22) Filed: Jan. 4, 2018

(65) Prior Publication Data

US 2018/0199429 A1    Jul. 12, 2018

Related U.S. Application Data

(60) Provisional application No. 62/443,910, filed on Jan. 9, 2017.

(51) Int. Cl.
*H05K 1/02* (2006.01)

(52) U.S. Cl.
CPC .......... *H05K 1/0245* (2013.01); *H05K 1/024* (2013.01); *H05K 1/025* (2013.01); *H05K 1/0216* (2013.01);
(Continued)

(58) Field of Classification Search
CPC .... H05K 1/0245; H05K 1/0216; H05K 1/024; H05K 1/0242; H05K 1/025
See application file for complete search history.

(56) References Cited

U.S. PATENT DOCUMENTS

| 4,371,742 A | 2/1983 | Manly |
| 6,982,378 B2 | 1/2006 | Dickson |

(Continued)

FOREIGN PATENT DOCUMENTS

| CN | 201540755 U | 8/2010 |
| JP | 2000022381 A | 1/2000 |

(Continued)

OTHER PUBLICATIONS

Shen et al., EMI Control Performance of the Absorbing Material for Application on Flexible Cables, Copyright 2016 IEEE, 6 pages.
(Continued)

*Primary Examiner* — Hoa C Nguyen
*Assistant Examiner* — Amol H Patel
(74) *Attorney, Agent, or Firm* — Harness, Dickey & Pierce, P.L.C.; Anthony G. Fussner (57) ABSTRACT

Exemplary embodiments are provided of absorber assemblies having dielectric spacers. In an exemplary embodiment, an absorber assembly includes a printed circuit board and a differential line disposed on the printed circuit board. The differential line includes a first trace and a second trace opposite the first trace. The assembly also includes a dielectric spacer coupled to the printed circuit board and covering at least a portion of the differential line, and an absorber coupled to the dielectric spacer to inhibit electromagnetic interference radiation from the differential line. Example methods of assembling an electromagnetic interference radiation absorber assembly for a differential line are also disclosed.

20 Claims, 6 Drawing Sheets

(52) U.S. Cl.
CPC ......... *H05K 1/0233* (2013.01); *H05K 1/0242* (2013.01); *H05K 1/0231* (2013.01); *H05K 2201/086* (2013.01); *H05K 2201/2036* (2013.01)

(56) References Cited

U.S. PATENT DOCUMENTS

| | | |
|---|---|---|
| 7,282,260 B2 | 10/2007 | LeGrande et al. |
| 7,554,829 B2 | 6/2009 | Forbes et al. |
| 7,880,576 B2 | 2/2011 | Matsuzaki |
| 8,283,571 B2 | 10/2012 | Lai et al. |
| 8,339,212 B2 | 12/2012 | Wu et al. |
| 8,922,303 B2 | 12/2014 | Kameya |
| 9,225,120 B2 | 12/2015 | Barr |
| 2003/0117787 A1 | 6/2003 | Nakauchi |
| 2004/0121652 A1* | 6/2004 | Gailus ................ H01R 13/6598 439/607.01 |
| 2009/0014847 A1 | 1/2009 | Chen et al. |
| 2014/0104802 A1 | 4/2014 | Oikawa |
| 2014/0218867 A1* | 8/2014 | Kim .................... H05K 9/0088 361/704 |
| 2016/0087323 A1 | 3/2016 | Wu et al. |
| 2017/0099728 A1 | 4/2017 | Janssen et al. |

FOREIGN PATENT DOCUMENTS

| | | |
|---|---|---|
| JP | 2001307561 A | 11/2001 |
| JP | 2010114137 A | 5/2010 |
| KR | 20120096432 A | 8/2012 |
| KR | 101280590 B1 | 7/2013 |
| KR | 20140024561 A | 3/2014 |
| WO | WO-2015158726 A1 | 10/2015 |

OTHER PUBLICATIONS

Eccosorb BSR, High-Loss, Ultra-Thin, Elastomeric Microwave Absorber, www.eccosorb.com, Oct. 8, 2008, 1 page.

* cited by examiner

ABSORBER ASSEMBLIES HAVING A DIELECTRIC SPACER, AND CORRESPONDING METHODS OF ASSEMBLY

CROSS-REFERENCE TO RELATED APPLICATION

This application claims the benefit and priority of U.S. Provisional Patent Application No. 62/443,910 filed Jan. 9, 2017. The entire disclosure of the above application is incorporated herein by reference.

FIELD

The present disclosure generally relates to absorber assemblies having a dielectric spacer and corresponding methods of assembly.

BACKGROUND

This section provides background information related to the present disclosure which is not necessarily prior art.

Differential signal lines on a PCB such as PCIe and USB channels can radiate energy which may interfere with other elements (e.g., WiFi antennas, GPS antennas, etc.) in the proximity.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

The inventors herein have recognized that a peripheral component interconnect express (PCIe) channel on a circuit board can radiate electromagnetic energy that can reduce the effectiveness of various systems. For example, the energy could reduce the sensitivity (e.g., de-sense, etc.) of various systems by coupling energy into antennas of the systems (e.g. WiFi antennas, global positioning system (GPS) antennas, etc.).

The inventors have also recognized that an absorber material laid directly on the PCIe circuit traces can effectively reduce this radiation. However, the PCIe signal traces contain a digital signal which could be adversely affected by placement of the absorber on the PCIe circuit traces. If placed directly on the PCB traces, the impedance of the traces in the contacting sections can change due to the high permittivity/permeability of the absorber. This may cause a reflection. Additionally, energy in the desired signal of the PCIe traces could be absorbed. This could also result in deterioration of the signal integrity.

Figure 1:
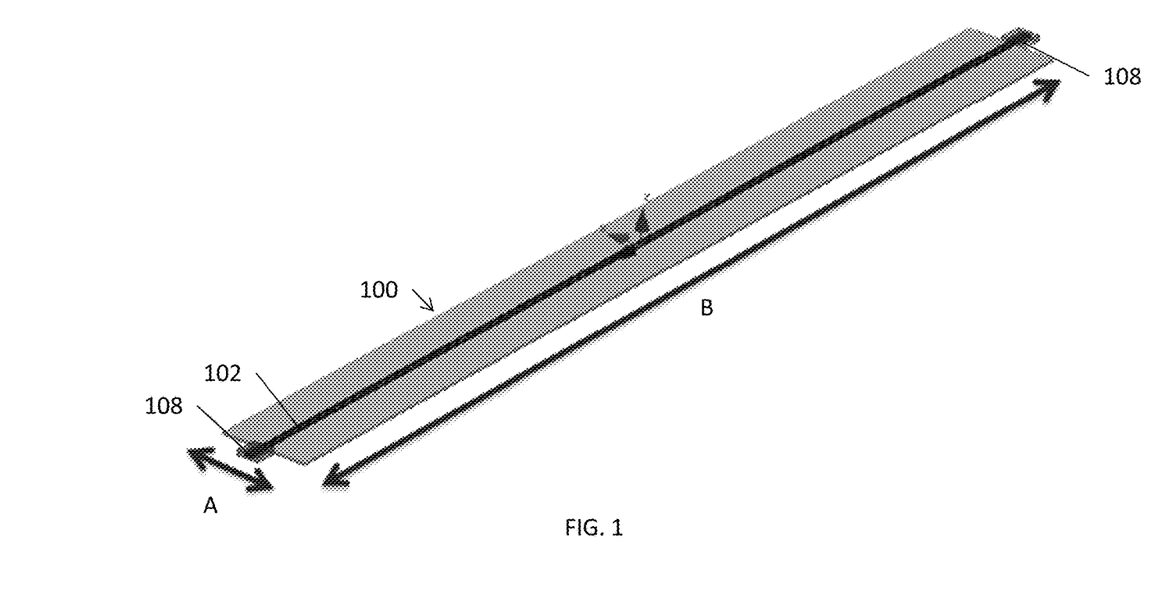
FIG. 1 is a perspective view of a differential line assembly according to one exemplary embodiment of the present disclosure.
Figure 2:
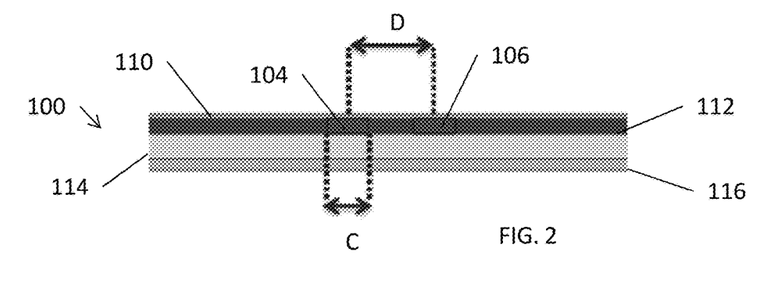
FIG. 2 is an end view of the differential line assembly of FIG. 1.

Exemplary embodiments are provided of absorber assemblies having dielectric spacers. FIGS. 1 and 2 illustrate an exemplary embodiment of a printed circuit board 100 having a differential line 102. The differential line 102 includes a positive trace 104 and a negative trace 106. The differential line 102 also includes end terminals 108 at opposite ends of the printed circuit board 100.

The differential line 102 is adapted to transmit a digital signal along the positive trace 104 and the negative trace 106. A voltage of the positive trace 104 may be a negative of the voltage of the negative trace 106. For example, the digital signal transmitted along the positive trace 104 may be substantially similar to the digital signal transmitted along the negative trace 106 (e.g., may have a same amplitude, etc.), but the digital signal transmitted along the positive trace 104 may have an opposite polarity as the digital signal transmitted along the negative trace 106 (e.g., a positive voltage versus a negative voltage, etc.).

The digital signal on the positive trace 104 may be subtracted from the digital signal on the negative trace 106 at an end terminal 108 of the differential line 102. For example, subtracting the digital signal on the positive trace 104 from the digital signal on the negative trace 106 may provide a signal that has double the magnitude (e.g., amplitude, etc.) of the original digital signal. Subtracting the digital signals may reduce common mode noise, may reduce interference of the differential line 102, etc.

The differential line 102 may be any suitable signal transmission line disposed on, in, etc. the printed circuit board 100. For example, the traces 104 and 106 may comprise any suitable conductor material (e.g., copper, etc.). The traces 104 and 106 may be disposed in a channel below a surface of the printed circuit board 100, the traces 104 and 106 may be disposed in a channel on a top of the surface of the printed circuit board 100, etc.

The printed circuit board 100 and differential line 102 may comprise any suitable signal transmission interface, including but not limited to a peripheral component interconnect express (PCIe) line, a universal serial bus (USB) line, etc.

FIGS. 1 and 2 illustrate example dimensions for the printed circuit board (PCB) 100 and the differential line 102. In some embodiments, a width A of the printed circuit board 100 may be about four millimeters, a length B of the printed circuit board may be about fifty millimeters, a width C of the traces 104 and 106 may be about 0.11 millimeters, a distance D between center points of the traces 104 and 106 may be about 0.23 millimeters, etc. As should be apparent, other embodiments may include other suitable dimensions.

As shown in FIG. 2, the printed circuit board 100 may include an optional solder layer 110 disposed over the traces 104 and 106. In some embodiments, the solder layer may have a thickness of about 0.0127 millimeters. As should be apparent, other embodiments may not include a solder layer 110, may include a solder layer 110 having a different thickness, may include a layer 110 comprising other materials, etc.

The printed circuit board 100 may also include a fill layer 112 surrounding the traces 104 and 106, such that the traces 104 and 106 are disposed within the fill layer 112. The fill layer 112 may comprise a suitable non-conductive material. In some embodiments, the fill layer 112 may have a thickness of about 0.0406 millimeters. As should be apparent, other embodiments may not include a fill layer 112, may include a fill layer 112 having a different thickness, etc.

An intermediate layer 114 may be disposed below the traces 104 and 106. The intermediate layer 114 may comprise a suitable non-conductive material. In some embodiments, the intermediate layer 114 may have a thickness of about 0.0686 millimeters. As should be apparent, other embodiments may not include an intermediate layer 114, may include an intermediate layer 114 having a different thickness, etc.

The printed circuit board 100 may include a bottom layer 116 disposed below the intermediate layer 114. The bottom layer 116 may include a conductive material (e.g., copper, etc.) and may be a ground plane for the traces 104 and 106. Accordingly, the intermediate layer 114 may provide insulation between the bottom layer 116 and the traces 104 and 106. In some embodiments, the bottom layer 116 may have a thickness of about 0.0305 millimeters. As should be apparent, other embodiments may not include a bottom layer 116, may include a bottom layer 116 having a different thickness, etc.

Figure 3:
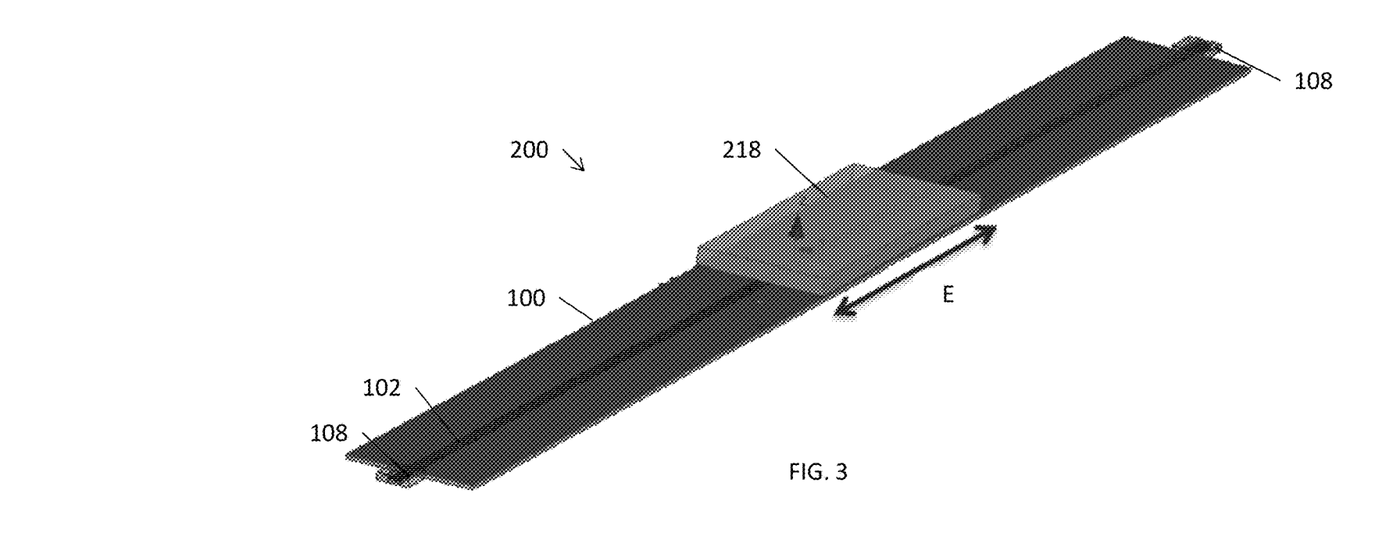
FIG. 3 is a perspective view of an absorber assembly according to another exemplary embodiment of the present disclosure.
Figure 4:
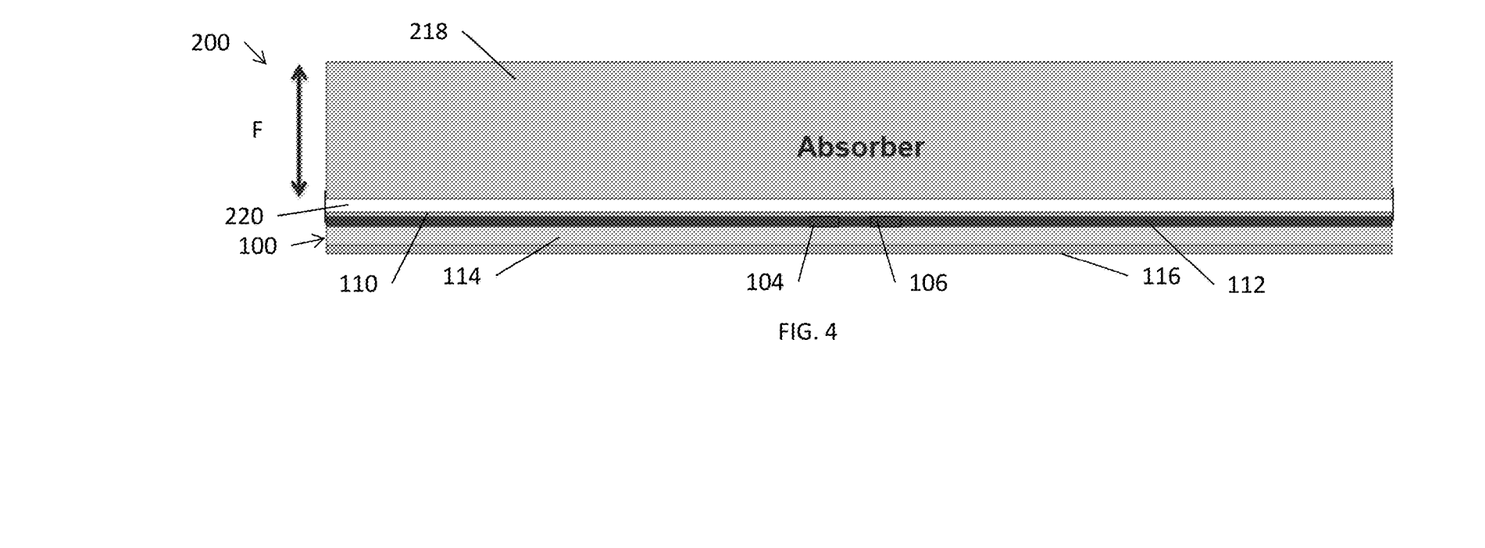
FIG. 4 is an end view of the absorber assembly of FIG. 3.

FIGS. 3 and 4 illustrate another exemplary embodiment of an absorber assembly 200 having a printed circuit board 100, a differential line 102, an absorber 218, and a dielectric spacer 220. As shown in FIGS. 3 and 4, the dielectric spacer 220 is coupled to the printed circuit board 100 and covers the traces 104 and 106 of the differential line 102. Although FIG. 4 illustrates the dielectric spacer 220 as extending beyond the traces 104 and 106, other embodiments may include a dielectric spacer 220 that is disposed over only the traces 104 and 106, covers only a portion of the traces 104 and 106, etc.

The absorber 218 is coupled to the dielectric spacer 220 to inhibit (e.g., reduce, etc.) electromagnetic interference (EMI) radiation from the differential line 102. The absorber 218 may comprise any suitable absorption material capable of absorbing (e.g., inhibiting, reducing, etc.) EMI radiation from the differential line 102. For example, the absorber 218 may include, but is not limited to, a magnetically loaded absorber made of silicone, urethane, epoxy, etc. The absorber 218 may include a filler made of iron, ferrite, etc. The filler may be dielectrically absorbent (e.g., carbon black, silicon carbide, etc.). This may reduce the amount of differential line EMI radiation that affects other system components (e.g., WiFi antennas, GPS antennas, etc.). In some embodiments, the absorber 218 may include a microwave absorber (e.g., may comprise a microwave absorption material, etc.).

The absorber 218 may be adapted to reduce EMI radiation from the differential line 102 by at least a specified reduction value. The specified reduction value may be a value suitable to inhibit (e.g., prevent) the EMI radiation from negatively affecting other system components (e.g., WiFi antennas, GPS antennas, etc.). Example specified reduction values may include, but are not limited to, a reduction of EMI radiation from the differential line by 5.9 decibels (dB), 6.7 dB, 6.9 dB, 7.4 dB, 7.6 dB, 8 dB, 8.3 dB, 10 dB, etc.

The specified reduction values may be calculated using any suitable electric field measurement techniques, including but not limited to measuring the electric field about 0.0708 millimeters above the top surface of the printed circuit board 100 along a center of the absorber 218. If the absorber 218 has a thickness of about 0.0508 millimeters, measuring at 0.0708 millimeters above the top surface of the PCB may result in measuring about 0.2 millimeters above the top surface of the absorber. Common mode excitation may be considered during simulations and measurement of the EMI reduction from the differential line 102 by the absorber 218. EMI reduction may be measured using a precision probe, a spectrum analyzer, etc.

As shown in FIG. 3, the absorber 218 covers only a portion of the differential line 102. In other embodiments, the absorber may cover all of the differential line 102, different portions of the differential line 102, etc. For example, the absorber 218 could have a width corresponding to a width of the differential line 102, a length corresponding to the length of the differential line 102, etc. As shown in FIG. 3, the width of the absorber 218 is about the width of the printed circuit board 100 (e.g., about four millimeters, etc.), and the length E of the absorber is about ten millimeters. As shown in FIG. 3, the height (e.g., thickness) of the absorber 218 is about 0.508 millimeters. As should be apparent, other embodiments may include absorbers having different widths, different lengths, different heights, etc.

As described above, the inventors herein have recognized that placing the absorber 218 directly on the differential line 102 may have an adverse effect on the signal integrity of the differential line. For example, impedance in the traces 104 and 106 may change due to the permittivity, permeability, etc. of the absorber 218. This may cause a reflection of the signal due to the absorber. In addition, energy in the differential line signal could be absorbed by the absorber 218, which may deteriorate the signal integrity.

As shown in FIG. 4, the absorber assembly 200 includes a dielectric spacer 220 coupled between the printed circuit board 100 and the absorber 218. In this case, the dielectric spacer 220 has one side coupled to a top surface of the PCB 100 above the traces 104 and 106 of the differential line 102, and an opposite side coupled to the absorber 218.

The dielectric spacer 220 is adapted to create a separation between the absorber 218 and the differential line 102, thereby reducing the effect of the absorber 218 on the integrity of the signal transmitted along the differential line 102. Accordingly, the dielectric spacer 220 has a thickness designed to allow the absorber 218 to absorb EMI radiation from the differential line 102, while inhibiting the effect of the absorber 218 on the differential line signal integrity.

The thickness of the dielectric spacer 220 may be any thickness suitable for inhibiting the absorber 218 from reducing the signal integrity of a signal transmitted along the differential line 102 below a specified threshold. For example, a signal of the differential line 102 may be represented by an eye diagram.

Figure 5:
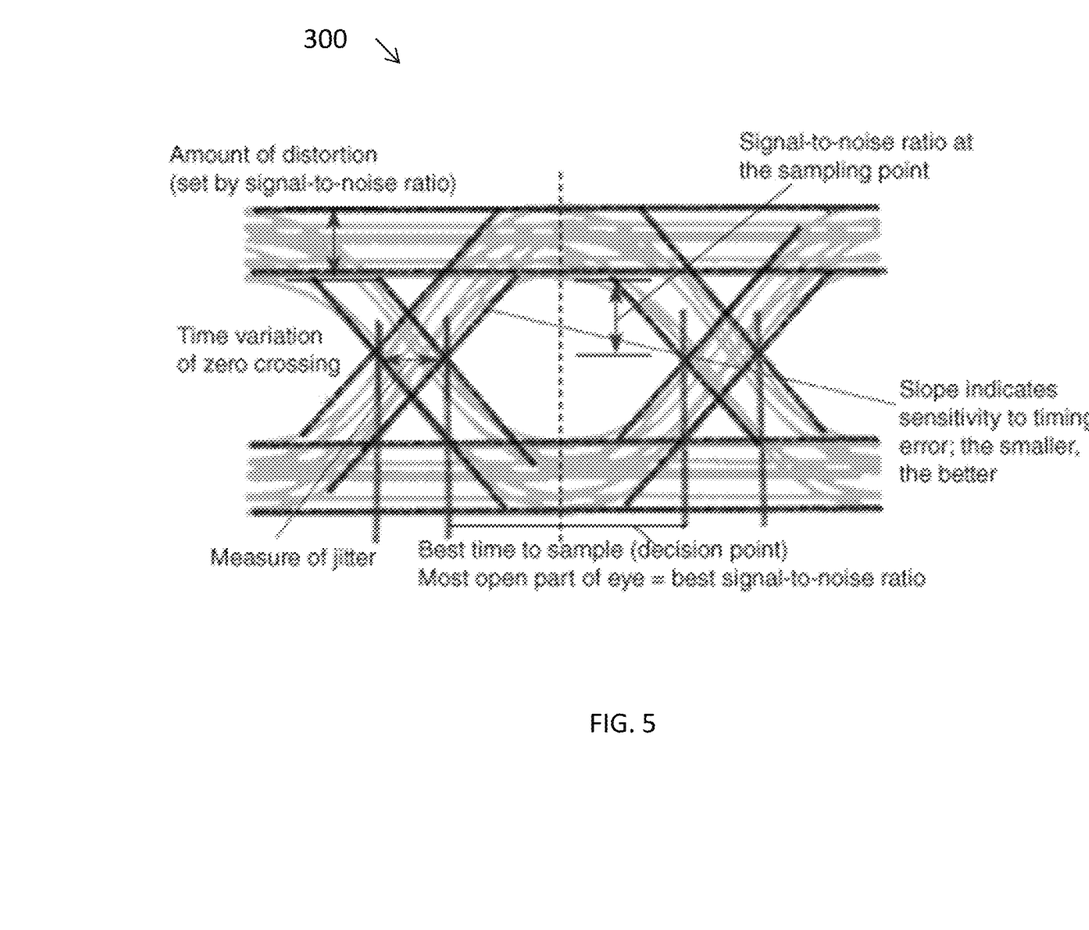
FIG. 5 is an eye diagram of signal integrity in the differential line of the absorber assembly of FIGS. 3 and 4.

An example eye diagram 300 is illustrated in FIG. 5. The eye diagram 300 is a graphical representation of the quality of a digital signal. In the eye diagram 300, each digital pulse is overlaid with one another. A perfect square wave with zero distortion would show a rectangular 'eye' opening. Finite rise and fall times, plus jitter (measure of how signal rate differs from perfection) and noise in the system, result in an 'eye' as shown in FIG. 5. Signal integrity engineers identify maximum values of distortions in the 'eye' as specifications for the quality of a digital signal.

In some embodiments, the thickness of the dielectric spacer 220 may be any thickness suitable for inhibiting the absorber 218 from reducing the eye diagram of a signal transmitted along the differential line 102 below a specified threshold. For example, the thickness of the dielectric spacer may inhibit the absorber 218 from reducing one or more aspects of the eye diagram signal integrity of the differential line 102 below a threshold (e.g., the signal-to-noise ratio of the sampling point, the slope of the signal, the time variation of the zero crossing of the signal, the jitter of the signal, etc.). In some embodiments, the eye diagram reduction may be limited to less than 0 ps, 0.5 ps, 0.8 ps, 0.9 ps, 1 ps, 1.1 ps, etc. As should be apparent, other embodiments may inhibit eye diagram signal integrity reductions to other amounts. Effects on the eye diagram may be modeled using Keysight ADS from modeled values of the transmission coefficients of the differential line.

In some embodiments, an optimal thickness of the dielectric spacer 220 may be determined based on a data rate (e.g., frequency) of the differential line 102. For example, to create a digital signal at a particular data rate, signals at different frequencies may be added together, as determined by Fourier Analysis. A digital waveform can be created by adding signals at the odd harmonics of on-half of the data rate. For example, to create a digital signal with data rate of 1 gigabit/second (1 Gbps) signals can be generated at 1 GHz, 2 GHz, 3 GHz, etc. In order to generate a perfect square wave, the sum of signals would go to infinity. However, a smaller number of harmonics (e.g., two harmonics, three harmonics, four harmonics, etc.) may adequately recreate a signal. The absorber 218 will have the largest effect on the signal at higher frequencies. For example, if there are three harmonics for a 1 Gbps data rate signal at 1 GHz, 2 GHz, and 3 GHz, the absorber 218 will have the greatest effect on the signal at 3 GHz.

As another example, if the data rate is 4 Gbps there may be harmonics at signal frequencies of 4 GHz, 8 GHz and 12 GHz. Because the absorber 218 will affect the highest frequency the most (e.g., 12 GHz), the effects can be mitigated at least partially by increasing the distance from the differential line 102 using a thicker dielectric spacer 220. In general, higher data rates may include dielectric spacers 220 having greater thickness.

Figure 6:
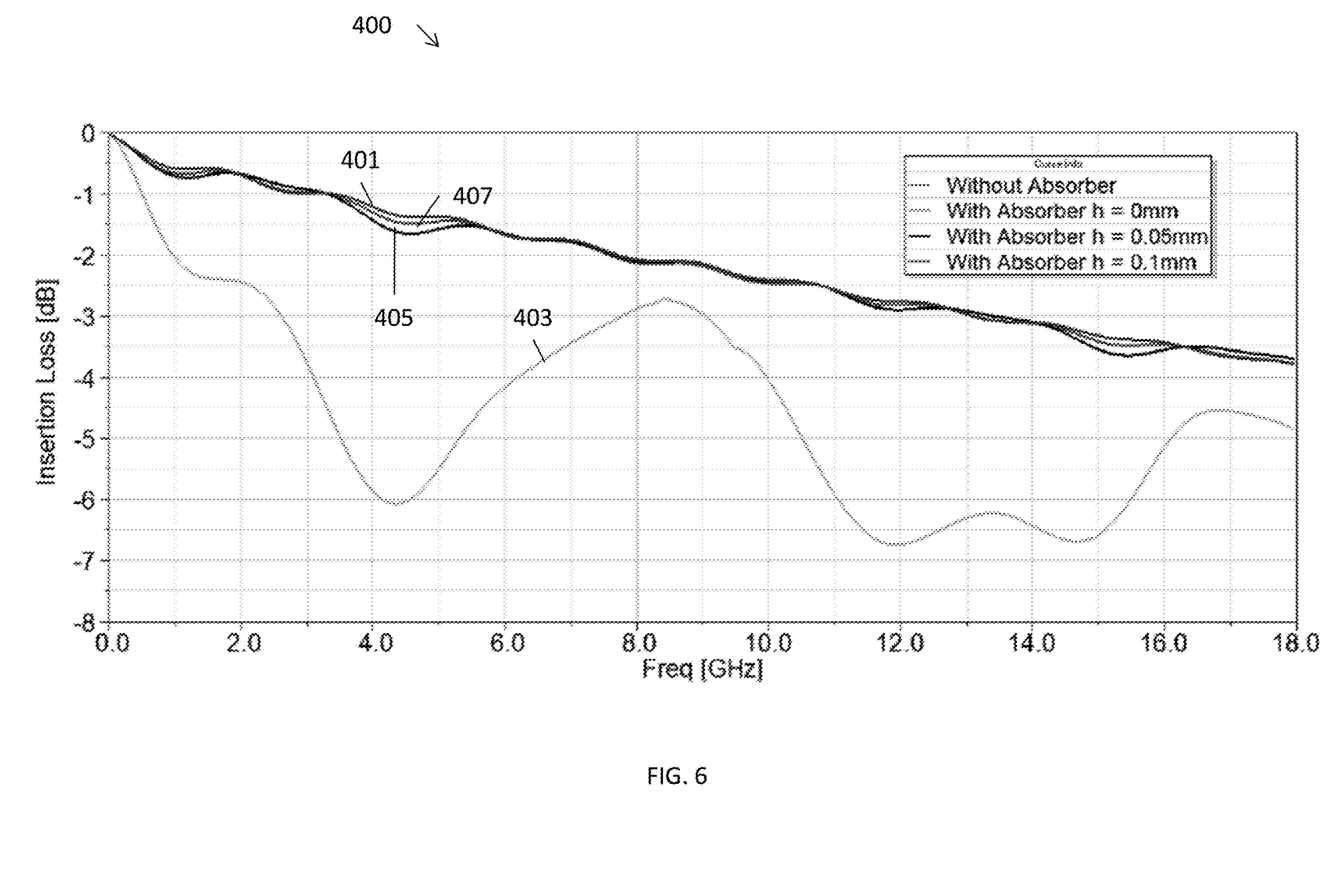
FIG. 6 is a line graph illustrating insertion loss of the differential line of the absorber assembly of FIGS. 3 and 4 for different dielectric spacer thicknesses.
Figure 7:
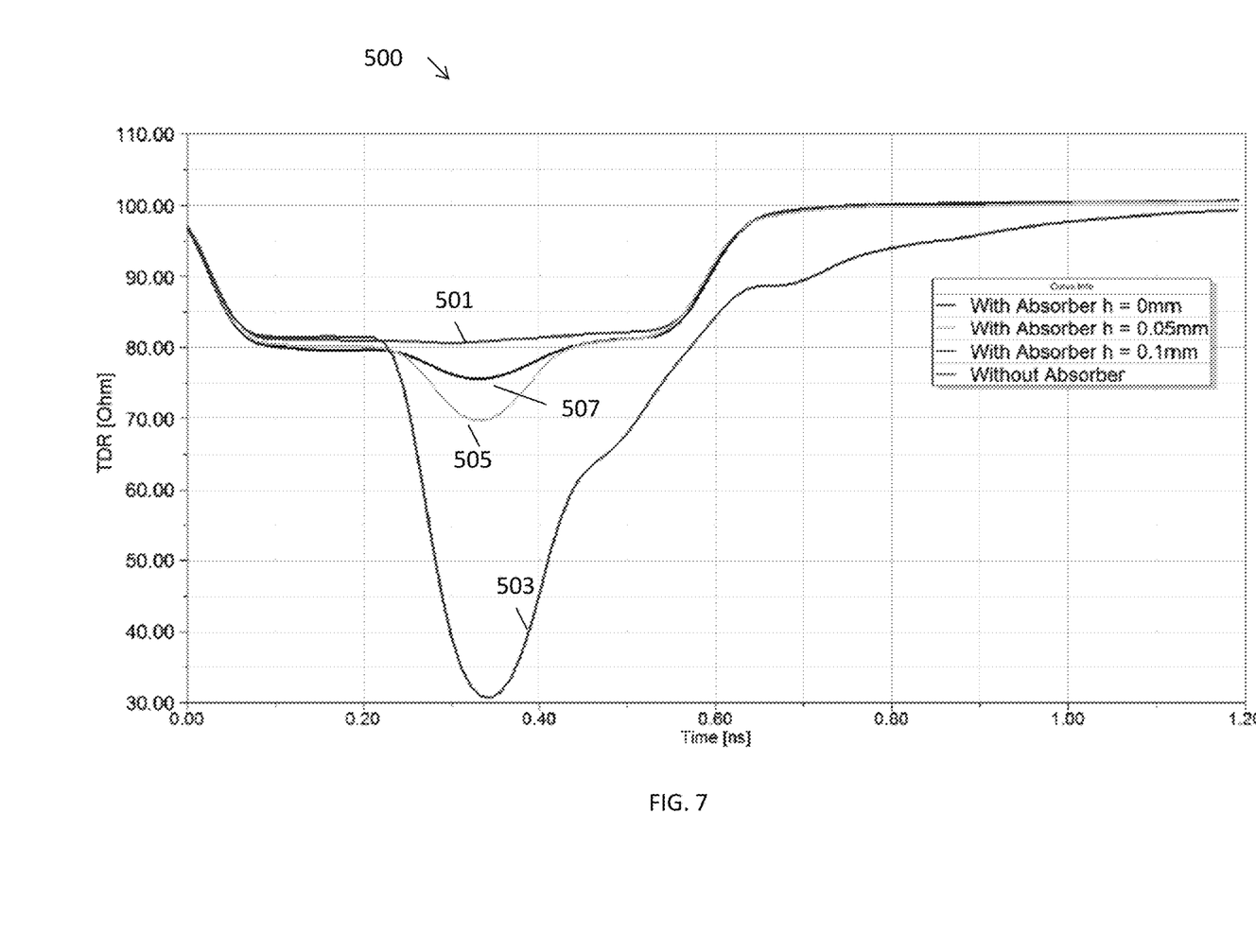
FIG. 7 is a line graph illustrating time domain reflection of the differential line of the absorber assembly of FIGS. 3 and 4 for different dielectric spacer thicknesses.
Figure 8:
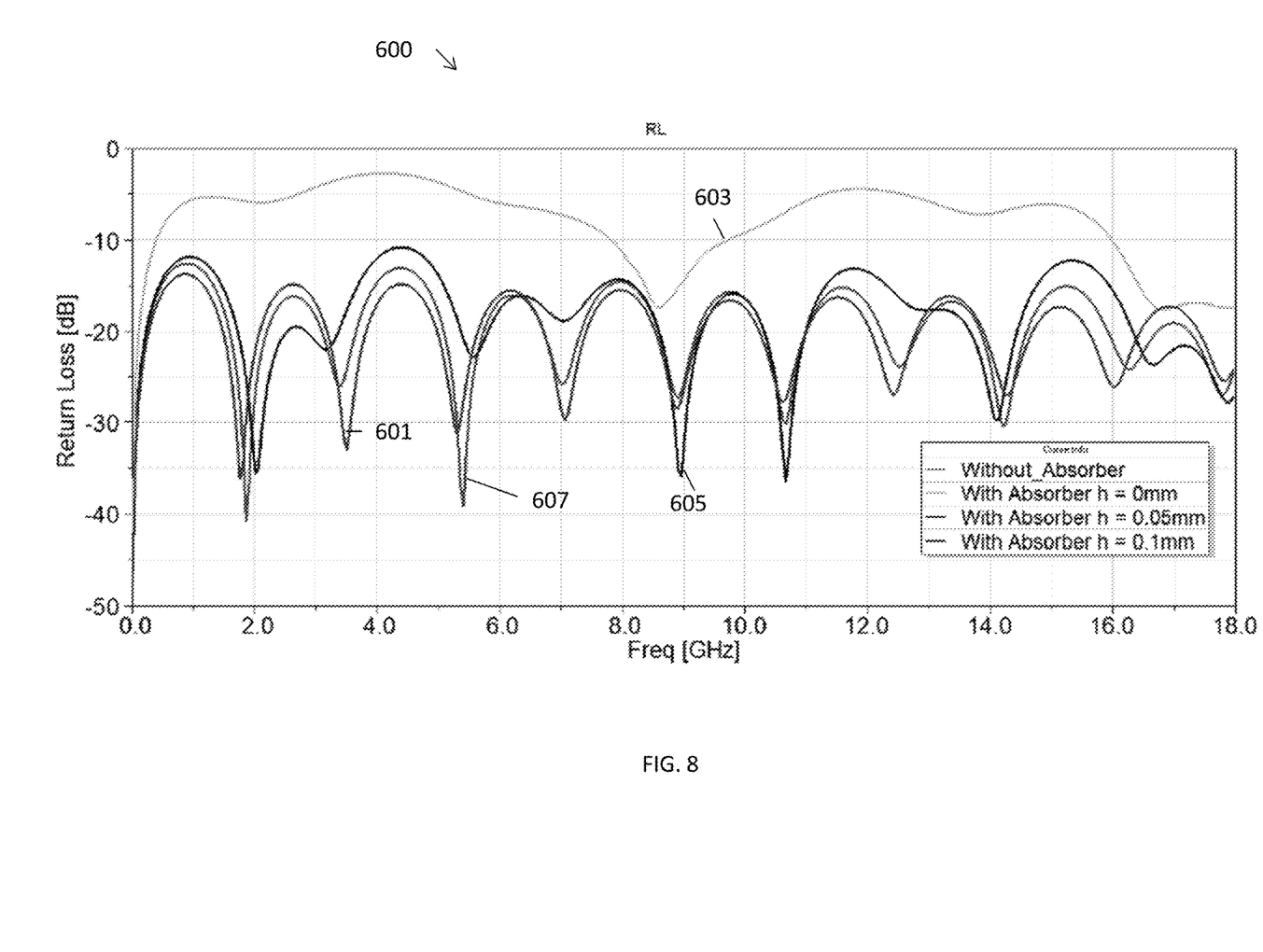
FIG. 8 is a line graph illustrating return loss of the differential line of the absorber assembly of FIGS. 3 and 4 for different dielectric spacer thicknesses.

As mentioned above, the dielectric spacer may any suitable thickness, including but not limited to about 0.05 millimeters, about 0.1 millimeters, etc. Different thicknesses may provide different characteristics for the differential line EMI radiation reduction by the absorber 218, the effect of the absorber on the signal integrity of the differential line 102, etc. FIGS. 6-8 illustrate example electrical characteristics of the absorber assembly 200 for different thicknesses of the dielectric spacer 220.

The dielectric spacer 220 may comprise any suitable dielectric material capable of inhibiting the effect of the absorber 218 on the signal integrity of the differential line 102. For example, the dielectric spacer 220 may include a pressure sensitive adhesive material.

FIG. 6 illustrates a line graph 400 of insertion loss of the transmission characteristics of the differential line 102 as a function of frequency (e.g., in the frequency domain), for different thicknesses of the dielectric spacer 220. The desired insertion loss characteristic of the signal is the insertion loss without the absorber 218 (as shown by line 401 in FIG. 6). When the absorber 218 is placed directly on the differential line 102 (as shown by line 403 in FIG. 6), the insertion loss changes dramatically. This may result in very poor (e.g., zero, etc.) signal integrity. For a dielectric spacer thickness of 0.05 millimeters (as shown by line 405 in FIG. 6), the insertion loss characteristic approaches the desired characteristic (e.g., the no absorber case). For a dielectric spacer thickness of 0.1 millimeters (as shown by line 407 in FIG. 6), the insertion loss characteristic further approaches the desired characteristic (e.g., the no absorber case). Note that as the separation between the absorber 218 and the differential line 102 increases (e.g., the thickness of the dielectric spacer 220 increases), the insertion loss returns to the desired condition.

FIG. 7 illustrates a line graph 500 of results of a time domain reflectometer (TDR) test, for different thicknesses of the dielectric spacer 220. The x-axis of FIG. 7 represents time. This test illustrates impedance of the differential line 102 as a function of time. The case with no absorber 218 is illustrated by line 501 in FIG. 7. With the absorber 218 directly on the differential line (as shown by line 503 in FIG. 7), there is a large impedance change at about 0.35 nanoseconds. This impedance change can cause a large reflection of the signal in the differential line 102, which can also affect the signal integrity. When the dielectric spacer thickness is increased to 0.05 millimeters (as shown by line 505 in FIG. 7), and to a thickness of 0.1 millimeters (as shown by line 507 in FIG. 7), the impedance change in the differential line 102 reduces as the absorber 218 is separated farther from the differential line 102.

FIG. 8 illustrates a line graph 600 of the return loss or the reflection from the differential line 102, for different values of dielectric spacer thickness. As shown in FIG. 8, the case with the absorber 218 directly on the differential line 102 (as shown by line 603 in FIG. 8) creates a large change from the return loss characteristics of the case with no absorber 218 (as shown by line 601 in FIG. 8). When the dielectric spacer thickness is increased to 0.05 millimeters (as shown by line 605 in FIG. 8), and to a thickness of 0.1 millimeters (as shown by line 607 in FIG. 8), the return loss in the differential line 102 reduces as the absorber 218 is separated farther from the differential line 102.

According to another example embodiment of the present disclosure, a method of assembling an electromagnetic interference radiation absorber assembly for a differential line is disclosed. The method includes coupling a dielectric spacer to a printed circuit board having a differential line to cover at least a portion of the differential line. The dielectric spacer has a first side, a second side opposite the first side, and a thickness defined between the first side and the second side. The method also includes coupling an absorber to the side of the dielectric spacer opposite the printed circuit board. The thickness of the dielectric spacer is sufficient to inhibit the absorber from reducing the signal strength of a signal transmitted along the differential line below a specified threshold, while allowing the absorber to reduce electromagnetic interference radiation from the differential line by at least a specified reduction value Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "includes," "including," "has," "have," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An absorber assembly comprising:
a printed circuit board;
a differential line disposed on the printed circuit board, the differential line including a first trace and a second trace opposite the first trace;
a dielectric spacer coupled to the printed circuit board and covering at least a portion of the differential line; and
an absorber coupled to the dielectric spacer to inhibit electromagnetic interference radiation from the differential line;
wherein the dielectric spacer has a thickness sufficient to inhibit the absorber from reducing signal integrity of a signal when transmitted along the differential line below a specified threshold; and
wherein the thickness of the dielectric spacer corresponds to a data rate at which the signal will be transmitted along the differential line.

2. The absorber assembly of claim 1, wherein the specified threshold includes one or more aspects of an eye diagram signal integrity of the differential line including at least one of a signal-to-noise ratio of a sampling point, a slope of the signal, a time variation of a zero crossing of the signal, and a litter of the signal.

3. The absorber assembly of claim 1, wherein the thickness of the dielectric spacer is sufficient to inhibit the absorber from reducing an eye diagram of the differential line below a specified threshold.

4. The absorber assembly of claim 1, wherein the specified threshold includes an eye diagram reduction less than 1.1 picoseconds.

5. The absorber assembly of claim 1, wherein the thickness of the dielectric spacer is sufficient to allow the absorber to reduce electromagnetic interference radiation from the differential line by at least a specified reduction value.

6. The absorber assembly of claim 5, wherein the thickness of the dielectric spacer is between about 0.05 mm and about 0.1 mm, and/or wherein the thickness of the dielectric spacer allows the absorber to reduce electromagnetic interference radiation from the differential line by at least a specified reduction value of 5.9 decibels.

7. The absorber assembly of claim 1, wherein the absorber comprises a magnetically loaded absorber made of at least one of silicone, urethane, and epoxy.

8. The absorber assembly of claim 7, wherein the absorber includes a filler made of at least one of iron, ferrite, carbon black, and silicon carbide.

9. The absorber assembly of claim 1, wherein the dielectric spacer comprises a pressure sensitive adhesive.

10. The absorber assembly of claim 1, wherein the absorber comprises a microwave absorber.

11. The absorber assembly of claim 1, wherein the differential line is one of a peripheral component interconnect express (PCIe) channel of the printed circuit board and a universal serial bus (USB) channel of the printed circuit board.

12. The absorber assembly of claim 1, wherein:
the differential line is adapted to transmit a digital signal along the first trace and the second trace;
a voltage of the first trace is a negative of the voltage of the second trace; and
the signal on the first trace is subtracted from the signal on the second trace at an end of the differential line to reduce common mode noise and interference of the differential line.

13. An absorber assembly comprising:
a dielectric spacer having a first side, a second side opposite the first side, and a thickness defined between the first side and the second side; and
an absorber coupled to the first side of the dielectric spacer;
wherein the second side of the dielectric spacer is adapted to couple to a printed circuit board having a differential line to cover at least a portion of the differential line, and the thickness of the dielectric spacer is sufficient to inhibit the absorber from reducing signal integrity of a signal transmitted along the differential line below a specified threshold, while allowing the absorber to reduce electromagnetic interference radiation from the differential line by at least a specified reduction value;
wherein the thickness of the dielectric spacer corresponds to a data rate at which the signal will be transmitted along the differential line.

14. The absorber assembly of claim 13, wherein the thickness of the dielectric spacer is between about 0.05 mm and about 0.1 mm, and/or wherein the thickness of the dielectric spacer allows the absorber to reduce electromagnetic interference radiation from the differential line by at least a specified reduction value of 5.9 decibels.

15. The absorber assembly of claim 13, wherein the dielectric spacer comprises a pressure sensitive adhesive, and/or wherein the specified threshold includes an eye diagram reduction less than 1.1 picoseconds.

16. The absorber assembly of claim 13, wherein the absorber comprises a magnetically loaded absorber made of at least one of silicone, urethane, and epoxy, and/or wherein the thickness of the dielectric spacer is sufficient to inhibit the absorber from reducing an eye diagram of the differential line below a specified threshold.

17. The absorber assembly of claim 16, wherein the absorber includes a filler made of at least one of iron, ferrite, carbon black, and silicon carbide, and/or wherein the specified threshold includes one or more aspects of an eye diagram signal integrity of the differential line including at least one of a signal-to-noise ratio of a sampling point, a slope of the signal, a time variation of a zero crossing of the signal, and a litter of the signal.

18. The absorber assembly of claim 13, wherein the differential line is one of a peripheral component interconnect express (PCIe) channel of the printed circuit board and a universal serial bus (USB) channel of the printed circuit board.

19. A method of assembling an electromagnetic interference radiation absorber assembly for a differential line, the method comprising:
coupling a dielectric spacer to a printed circuit board having a differential line to cover at least a portion of the differential line, the dielectric spacer having a first side, a second side opposite the first side, and a thickness defined between the first side and the second side; and
coupling an absorber to the side of the dielectric spacer opposite the printed circuit board;
wherein the thickness of the dielectric spacer is sufficient to inhibit the absorber from reducing signal strength of a signal transmitted along the differential line below a specified threshold, while allowing the absorber to reduce electromagnetic interference radiation from the differential line by at least a specified reduction value; and
wherein the method further comprises determining an optimal thickness for the dielectric spacer based on a data rate at which the signal will be transmitted along the differential line, wherein the optimal thickness is increased as the data rate at which M the signal will be transmitted along the differential line is increased.

20. The method of claim 19, wherein:
the thickness of the dielectric spacer allows the absorber to reduce electromagnetic interference radiation from the differential line by at least a specified reduction value of 5.9 decibels; and/or
the thickness of the dielectric spacer is sufficient to inhibit the absorber from reducing an eye diagram of the differential line below a specified threshold of less than 1.1 picoseconds; and/or
the specified threshold includes one or more aspects of an eye diagram signal integrity of the differential line including at least one of a signal-to-noise ratio of a sampling point, a slope of the signal, a time variation of a zero crossing of the signal, and a litter of the signal.

* * * * *

UNITED STATES PATENT AND TRADEMARK OFFICE
CERTIFICATE OF CORRECTION

PATENT NO. : 10,212,806 B2  
APPLICATION NO. : 15/862334  
DATED : February 19, 2019  
INVENTOR(S) : Paul Francis Dixon et al.

Page 1 of 1

It is certified that error appears in the above-identified patent and that said Letters Patent is hereby corrected as shown below:

In the Claims

Claim 2
Column 8, Line 39; replace "litter" with "jitter"

Claim 17
Column 10, Line 6; replace "litter" with "jitter"

Claim 20
Column 10, Line 49; replace "litter" with "jitter"

Signed and Sealed this
Twenty-third Day of November, 2021

Drew Hirshfeld
*Performing the Functions and Duties of the
Under Secretary of Commerce for Intellectual Property and
Director of the United States Patent and Trademark Office*